United States Patent
Ghesquiere

(10) Patent No.: US 10,087,515 B2
(45) Date of Patent: Oct. 2, 2018

(54) GOLD OR SILVER METALLIZED PLASTIC PRODUCT FREE OF ANY GOLD AND SILVER ELEMENT AND METHOD FOR MANUFACTURING IT

(71) Applicant: ALBÉA SERVICES, Gennevilliers (FR)

(72) Inventor: Cécile Ghesquiere, Plouhinec (FR)

(73) Assignee: Albea Services, Gennevilliers (FR)

( * ) Notice: Subject to any disclaimer, the term of this patent is extended or adjusted under 35 U.S.C. 154(b) by 1008 days.

(21) Appl. No.: 13/737,463

(22) Filed: Jan. 9, 2013

(65) Prior Publication Data
US 2013/0288071 A1  Oct. 31, 2013

(30) Foreign Application Priority Data
Jan. 12, 2012 (FR) .................... 12 50328

(51) Int. Cl.
C23C 14/20 (2006.01)
C23C 14/00 (2006.01)
(Continued)

(52) U.S. Cl.
CPC ........ C23C 14/205 (2013.01); C23C 14/0015 (2013.01); C23C 14/165 (2013.01);
(Continued)

(58) Field of Classification Search
CPC ....... B32B 15/04; B32B 15/043; B32B 15/08; B32B 15/082; B32B 15/09; B32B 15/095; B32B 15/20; C23C 14/0015; C23C 14/024; C23C 14/025; C23C 14/20; C23C 14/205; C23C 14/14; C23C 14/16; C23C 14/34; C23C 14/165; C23C 28/023; C23C 28/02; C23C 30/00; C25D 5/12; C25D 5/14;
(Continued)

(56) References Cited

U.S. PATENT DOCUMENTS 4,106,859 A * 8/1978 Doriguzzi et al. ............ 349/113
4,863,808 A    9/1989 Sallo
(Continued)

FOREIGN PATENT DOCUMENTS

JP   56-084463 A   7/1981
WO   02/064862 A2  8/2002

OTHER PUBLICATIONS

French Application No. 1250328—Search Report dated Jul. 4, 2012.

*Primary Examiner* — Michael E. La Villa
(74) *Attorney, Agent, or Firm* — Banner & Witcoff, Ltd.

(57) ABSTRACT

The invention relates to a method for manufacturing a metallized plastic product with a gold or silver hue, comprising the steps:

Figure 1:
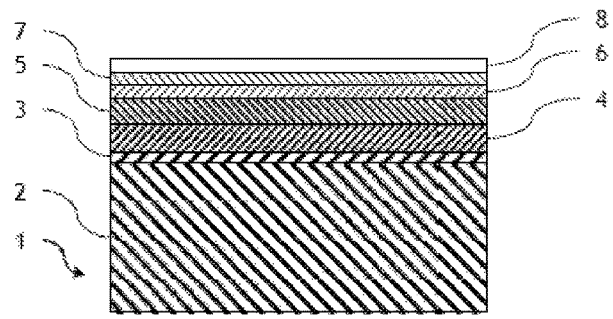

galvanization of a surface of the plastic body for forming a galvanized chromium layer;

deposition by evaporation of a metal layer directly on the galvanized chromium layer, the metal being copper, a mixture of metals comprising at least 70% by weight of copper, a copper alloy comprising at least 70% by weight of copper, or aluminum.

The invention also relates to a metallized plastic product (1) with a gold or silver hue, comprising a plastic body (2), a galvanized chromium layer (3, 4, 5, 6), and a metal layer (7), the metal being copper, a mixture of metals comprising at least 70% by weight of copper, an alloy containing copper in an amount of at least 70% by weight, or aluminum.

21 Claims, 1 Drawing Sheet

(51) Int. Cl.
*C25D 5/12* (2006.01)
*C25D 5/14* (2006.01)
*C25D 5/48* (2006.01)
*C25D 5/56* (2006.01)
*C23C 14/16* (2006.01)

(52) U.S. Cl.
CPC ............... *C25D 5/12* (2013.01); *C25D 5/14* (2013.01); *C25D 5/48* (2013.01); *C25D 5/56* (2013.01); *Y10T 428/1266* (2015.01); *Y10T 428/1275* (2015.01); *Y10T 428/1291* (2015.01); *Y10T 428/12542* (2015.01); *Y10T 428/12569* (2015.01); *Y10T 428/12611* (2015.01); *Y10T 428/12618* (2015.01); *Y10T 428/12667* (2015.01); *Y10T 428/12736* (2015.01); *Y10T 428/12847* (2015.01); *Y10T 428/12854* (2015.01); *Y10T 428/12882* (2015.01); *Y10T 428/12903* (2015.01); *Y10T 428/12931* (2015.01); *Y10T 428/12937* (2015.01); *Y10T 428/12944* (2015.01); *Y10T 428/12993* (2015.01); *Y10T 428/2495* (2015.01); *Y10T 428/24967* (2015.01); *Y10T 428/263* (2015.01); *Y10T 428/264* (2015.01); *Y10T 428/265* (2015.01)

(58) Field of Classification Search
CPC ..... C25D 5/48; C25D 5/56; Y10T 428/12542; Y10T 428/12569; Y10T 428/12736; Y10T 428/1275; Y10T 428/12847; Y10T 428/12854; Y10T 428/12903; Y10T 428/1291; Y10T 428/12882; Y10T 428/12931; Y10T 428/12937; Y10T 428/12944; Y10T 428/12993; Y10T 428/12611; Y10T 428/12618; Y10T 428/1266; Y10T 428/12667; Y10T 428/2495; Y10T 428/24967; Y10T 428/265; Y10T 428/264; Y10T 428/263
USPC ............... 428/626, 622, 652, 666, 671, 674
See application file for complete search history.

(56) References Cited

U.S. PATENT DOCUMENTS

| | | |
|---|---|---|
| 5,013,410 A | 5/1991 | Kagechika et al. |
| 6,468,672 B1 * | 10/2002 | Donovan et al. ............ 428/626 |
| 6,561,679 B1 | 5/2003 | Erion et al. |
| 2005/0179254 A1 | 8/2005 | Heim et al. |
| 2005/0185518 A1 | 8/2005 | Kawakami et al. |
| 2009/0008259 A1 | 1/2009 | Chan |
| 2010/0061884 A1 * | 3/2010 | Clark et al. ............... 420/472 |

* cited by examiner

GOLD OR SILVER METALLIZED PLASTIC PRODUCT FREE OF ANY GOLD AND SILVER ELEMENT AND METHOD FOR MANUFACTURING IT

CROSS-REFERENCE TO RELATED APPLICATIONS

This application claims priority under 35 U.S.C. § 119 to Application FR 1250328, filed Jan. 12, 2012, the contents of which is hereby incorporated by reference in its entirety.

FIELD OF THE INVENTION

The invention relates to the field of manufacturing at least partly metallized plastic products from a plastic body. In particular, the invention relates to the field of manufacturing at least partly metallized plastic products in order to give them a gold or silver hue.

State of the Art

Today, the methods for manufacturing at least partly metallized products from a plastic body in order to give it a gold or silver hue consist in coating the plastic body with a layer of precious metal (gold or silver).

Now, the use of a precious metal significantly increases the cost for manufacturing the golden or silvery plastic product obtained. Very often, the cost of the precious metal represents half of the total manufacturing cost of the at least partly metallized plastic product with a gold or silver hue.

Methods with which it is possible to do without any precious metal exist. For example, JP 56-84463 proposes a method for manufacturing a plastic product from a plastic body in order to give it a hue close to that of gold. This method consists of applying on the plastic body an organic sublayer after washing the surface of the plastic body. The sublayer is typically in polyester, acrylic or polyurethane. Next, a layer of a Cu—Al alloy is deposited on the sublayer by cathode sputtering. Finally the Cu—Al alloy layer is covered with a transparent organic overlayer in polyester, acrylic or polyurethane.

Although this method makes it possible to obtain metallized plastic products having a color close to that of gold, the plastic products obtained do not have the same cold touch as plastic products traditionally covered with a layer of precious metal. Moreover, the obtained gold color and brightness, although satisfactory, are far from attaining the color and/or brightness obtained with a gold layer.

A solution for improving the obtained gold color is to use a colored overlayer. However, the obtained improvement is not definitive since the pigments or coloring agents of the overlayer lose their color subsequently to repeated exposure to light or subsequently to contact with a chemical product.

The inventors while trying to overcome these drawbacks, were surprised in discovering that galvanization of a plastic body in order to form a nickel layer before depositing a layer of copper or of alloy comprising copper in an amount of at least 70% by weight only gave a poor result as to the color and the brightness of the obtained gold hue, and that on the other hand galvanization of a plastic body for forming a chromium layer before depositing a layer of copper, of a mixture of metals comprising at least 70% by weight of copper or of an alloy comprising copper in an amount of at least 70% by weight gave a remarkably satisfactory result with a color and a brightness closer to those of the plastic products obtained with methods of the prior art.

Indeed, the color of nickel is yellowish white with a polished brightness while the color of chromium is bluish grey with a polished brightness. The color of nickel is therefore closer to that of gold than the color of chromium. This is why the inventors were surprised in discovering that the combination of chromium with copper provided a superior result than the combination of nickel with copper.

Likewise, the inventors discovered that this method in which copper, the mixture of metals comprising at least 70% by weight of copper or the alloy comprising at least 70% by weight of copper, is replaced with aluminum, also gave the possibility of obtaining an at least partly metallized plastic product with a silver hue, the color and the brightness of which are remarkably close to that of a metallized plastic product comprising silver.

Moreover, the hue obtained with chromium and copper (or copper alloy) is so close to that of gold that it is no longer necessary to use a colored overlayer for rectifying the latter.

Presentation of the Invention

An object of the present invention is therefore to overcome the drawbacks of the prior art as shown above. To this aim, the invention proposes a method for manufacturing an at least partly metallized plastic product and free of any gold and silver element from a plastic body in order to give the plastic body the hue of gold or silver.

The plastic body may be in acrylonitrile-butadiene-styrene (ABS), in a polymeric alloy of acrylonitrile-butadiene-styrene and polycarbonate (ABS/PC), polyoxymethylene (POM), polypropylene (PP), or polyamide (PA), the last two being generally modified with mineral fillers, i.e. containing mineral inclusions such as calcium carbonate, glass fibers. The mineral fillers allow galvanization of PP and of PA.

The term «metallized» means that the plastic product comprises at least one metal layer on a visible portion of its surface.

The terms «gold and silver element» designate the gold and silver metals as well as the mixtures or alloys comprising gold or silver.

The obtained gold or silver hue may be evaluated by its color and its brightness.

The term «color» refers to the a* and b* components of light reflected by the final metallized plastic product in the CIE L*a*b* system described below. The color of gold comprises the following components: A* between 1 and 4; and b* between 10 and 30. The color of silver comprises the following components: a* between −1 and 1; and b* between 2 and 10.

The term «brightness» refers to the luminosity L*. The brightness of gold corresponds to L* (in the CIE L*a*b* system) comprised between 80 and 90. The brightness of silver corresponds to a luminosity L* comprised between 85 and 98, generally 95.

The method comprises the following steps:
  direct galvanization of a surface of the plastic body to be metallized for forming a galvanized chromium layer directly on the surface of the plastic body to be metallized;
  deposition by evaporation, preferably by cathode sputtering, of a metal layer directly on the chromium layer, the metal being copper, a mixture of metals comprising at least 70% by weight of copper, a copper alloy comprising at least 70% by weight of copper, or aluminum.

«Direct galvanization» means that this step is carried out directly on the surface of the plastic body without applying any preliminary organic sublayer.

The galvanization step may be carried out in the following way:
  the plastic body is made conductive for example with acid etching by soaking, for example in a solution of sulfochromic acid, and is then followed by a deposition of a preparation layer in nickel or in copper via a chemical route activated with palladium (i.e. the palladium is a catalyst) (chemical range);

a cover of copper and/or of nickel is deposited electrolytically (i.e. by means of electrolysis) directly onto the preparation layer (physical range); and the chromium layer is deposited via an electrolytic route onto the copper and/or nickel cover.

The solution of sulfochromic acid is for example a solution of chromic acid with a concentration comprised between 100 and 500 g/L and of sulfuric acid with a concentration comprised between 300 and 800 g/L.

Soaking is carried out at a temperature comprised between 60° C. and 80° C. for 2 to 12 minutes.

The preparation layer in nickel or in copper deposited via a chemical route, activated with palladium, typically has a thickness comprised between 2 and 5 µm.

The electrolytically deposited copper cover has a thickness comprised between 5 and 30 µm, preferably between 8 and 15 µm, even more preferentially of about 12 µm. this is done through electrolysis by soaking the plastic body covered with the preparation layer in a tank filled with electrolytes, for example a mixture of copper sulfate and of sulfuric acid in solution, for 10 to 40 minutes. The plastic body forms a first electrode. A second phosphorus-copper electrode is immersed in the tank. A flow of current is then applied between both electrodes and through the tank filled with electrolytes.

The deposited electrolytically nickel cover has a thickness comprised between 2 and 20 µm, preferably between 8 and 12 µm, even more preferentially of about 12 µm. This is done through electrolysis by soaking the plastic body in a tank filled with electrolytes, for example a mixture of nickel sulfate, nickel chloride and boric acid in solution, for 10 to 40 minutes. The plastic body forms a first electrode. A second nickel metal electrode is also immersed in the tank. A flow of current is then applied between both electrodes and through the tank filled with electrolytes.

The electrolytically deposited nickel cover may be made in a superposed way over the electrolytically deposited copper cover.

The chromium layer deposited via an electrolytic route has a thickness comprised between 0.1 and 2 µm, preferably between 0.5 and 1.5 µm, even more preferentially of about 0.9 µm. Moreover the chromium gives the possibility of improving the adhesion of the following layers.

With galvanization, it is possible to obtain a plastic product with a cold touch like that of precious metals by the electrolytically deposited copper and/or nickel cover. With galvanization, it is also possible to give a smooth aspect like that of gold or silver the surface of the plastic body.

By using chromium, in a combination of copper deposited by evaporation, it is possible to obtain a metallized plastic product with color and brightness comparable to those of gold metal, whether it is so-called «white gold», «yellow gold», or «rose gold».

The metal layer deposited by evaporation has a thickness comprised between 30 and 100 nm, preferentially 50 nm.

When the metal deposited by evaporation is copper, the obtained plastic product has the color of rose gold.

Next when a mixture or an alloy is used instead of copper, hues from rose gold through yellow gold to white gold are obtained. More particularly, when the weight of copper represents between 95 and 100% of that of the mixture or of the copper alloy, the hue of rose gold is obtained; when the weight of copper represents between 70 and 80% of the mixture or that of the copper alloy, the hue of white gold is obtained. The hue of yellow gold is more sought than those of rose gold or white gold. In order to obtain this hue, the weight of copper preferentially represents between 80 and 95% of that of the mixture or of the copper alloy.

In an alternative, the copper alloy used is a Cu—Al alloy. By using aluminum, it is possible to obtain better brightness than with for example zinc or tin which gives a duller gold hue since aluminum is brighter than zinc or tin. Aluminum is the metal with low economical cost providing the best brightness to the gold hue.

Moreover, the use of a Cu—Al alloy for the deposition by evaporation, and notably cathode sputtering, has the other advantage that the behaviors of copper and aluminum during this step are very close. Thus, it is possible to homogeneously deposit the copper and the aluminum without modifying the stoichiometry of the alloy used. This is not true for copper and zinc or copper and tin.

Preferably, the Cu—Al alloy comprises between 70 and 95% by weight of copper and between 5 and 30% by weight of aluminum with a maximum of 5% of impurities. Even more preferentially, the Cu—Al alloy comprises between 92 and 94% by weight of copper and between 6 and 8% by weight of aluminum.

The metal used for the deposition by evaporation may be aluminum. Thus it is possible to obtain the silver hue.

The deposition by evaporation may for example be achieved by thermal evaporation or by cathode sputtering.

Thermal evaporation is carried out in vacuo. The metal to be deposited on the surface of the plastic body is typically used in the form of a wire or a lamella laid on the tungsten filaments which are heated up to sublimation. The metal vapor developing from this is then deposited on all the surfaces present inside the vacuum chamber.

Cathode sputtering consists in bombarding a sample of the metal or alloy to be deposited with argon ions in a magnetically reinforced plasma. Bombardment of argon ions causes ejection of molecules of the metal or of the alloys to be deposited towards the surface of the chromium-galvanized plastic body.

More particularly, the cathode sputtering to which reference is made here, is typically non-reactive, i.e. cathode sputtering is carried out in a partial vacuum in the presence of an inert gas, generally argon. Non-reactive cathode sputtering which allows deposition of pure metal or an alloy, is a faster and easier method to control than reactive cathode sputtering which leads to deposition of metal oxide and nitrides. During production, cathode sputtering is carried out in a reaction chamber size range from a small chamber with a capacity of less than 50 liters with cycle durations of a few seconds, to a large simple chamber, for example with a diameter of 2 meters with cycle durations from 10 to 30 minutes depending on the pumping system used.

Usually, the vacuum is applied inside a reaction chamber in which the plastic body is positioned, by means of a pumping system down to about $10^{-4}$ and $10^{-5}$ mbars. A controlled amount of inert gas, generally argon, is injected into the inside of the chamber by a simple pressure difference until the latter attains about $10^{-3}$ mbars. The metal or alloy to be deposited is used as a circular or rectangular plate and is called a «target», for example with dimensions 420 mm×100 mm. The thickness of the target is less than 20 mm, for example comprised between 5 and 20 mm, preferably 10 and 15 mm and the latter is mounted on a magnetron with the same shape and cooled with water. The magnetron consists in a network of 3 neodymium magnets in which the magnets are positioned so that the polarities are alternating:

N-S-N or S-N-S, in order to generate a dual magnetic field in which the target lies. A high voltage, typically provided by a DC voltage source, is applied so that the target is negatively charged forming a cathode. The cathode sputtering power is adjusted between 10 and 40 kW, typically 30 kW. The speed of rotation of the plastic body is adjusted between 20 and 200 rpm, typically a 100 rpm. The argon flow is set to a value comprised between 200 and 700 cm$^3$/min, typically 500 cm$^3$/min. A plasma is then generated and leads to the target by the action of the magnetic field. The excited electrons of the plasma collide with the argon atoms in the reaction chamber producing positively charged argon ions moving towards the target by magnetic attraction. The collisions of the argon ions with the target cause ejection at a high energy of atoms of the target inside the chamber and in particular towards the surface of the plastic body to be metallized. Cathode sputtering is carried out at a higher pressure than thermal evaporation, therefore the mean free path of the ejected atoms is shorter. This is why, while the distance from the plastic product to the target is from 250 to 500 mm for thermal evaporation, the latter is generally 5 to 10 times less for cathode sputtering, it is comprised between 20 and 200 mm. The high energy required for this method involves more significant heating of the plastic product. But for metal layers with a thickness of less than 100 nm, this is not generally a problem. The deposition rate of a given metal depends on the distance and on the power used, which typically varies between 5 and 50 W/cm$^2$ of the target and the duration of the deposition may then vary from less than a second to more than one minute.

When the metal used is a mixture of metals comprising at least 70% by weight of copper, at least two targets are used, one per metal entering the composition of the mixture. The cathode sputtering parameters are individualized for each of the targets in order to give the metal layer the right composition.

The method also comprises the step for applying a protective overlayer. Given that by means of the present method, this hue of precious metals is sufficiently reproduced, it is not necessary to correct this hue, like in the prior art, with a colored protective overlayer. Thus the protective overlayer may be transparent without this being detrimental to the aimed gold or silver hue.

Moreover, an overlayer protection of the layer requires the use of pigments or coloring agents. Now, pigments and coloring agents are sensitive to light and/or to chemicals (such as cosmetic products) and their color then changes in a irreversible way, then having a duller, less vivid aspect. This is why, over time, the metallized products with a gold or silver hue from the state of the art lose their color and/or their brightness.

The protective overlayer may be organic, transparent, such as in polyester, acrylic, acrylate or polyurethane or inorganic transparent such as of the SiO$_x$ type.

When the protective overlayer is organic, its thickness is comprised between 6 and 30 µm.

The product described above is advantageously used for manufacturing at least one portion of a package for a cosmetic product such as the lid, plug, sheath, trim of the bottle for perfume, mascara, lipstick, powder, etc.,

PRESENTATION OF THE DRAWINGS

FIG. 1 schematically illustrates an at least partly metallized plastic product with a gold or silver hue free of any gold and silver elements. This plastic product 1 is obtained with the method of the present invention. This plastic product 1 comprises a plastic body 2 successively covered with a preparation layer in nickel or in copper 3, with a copper cover 4, with a nickel cover 5, with a chromium layer 6, with a metal layer 7 (copper, mixture of metals comprising at least 70% by weight of copper, copper alloy comprising at least 70% by weight of copper, silver) and with a transparent protective organic overlayer 8.

Figure 2:
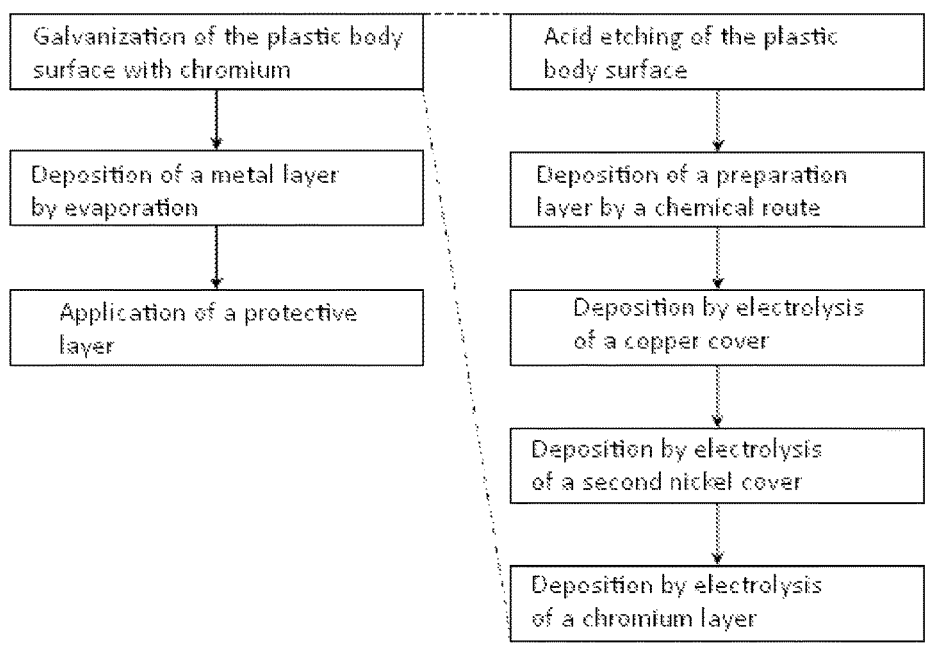

FIG. 2 is a diagram schematically illustrating an exemplary embodiment of the method according to the invention.

MEASUREMENT METHOD

The gold or silver hue is measured in the CIE model for representing colors, L*a*b* which represents a color with three components:
- the component L* is luminosity ranging from zero (black) to 100 (white);
- the component a* represents the chromatic range of the red-green axis (respectively positive and negative values);
- the component b* represents the chromatic range of the yellow-blue axis (respectively positive and negative values).

The value of the component L* represents luminosity. The greater the value of L* and the more significant is the brightness.

The components a* and b* correspond to the color.

The measurement is conducted with a spectro-colorimeter BYK-Gardner No. 6834. Before the measurement, the calibration of the apparatus is checked by means of standard plates provided with the spectro-colorimeter.

The sample should be clean and free of scratches and have a surface adapted to the apparatus.

For each sample, five measurements are carried out and the average for each of the components L*, a* and b* is calculated.

EXAMPLES

Example 1

An exemplary method for manufacturing an at least partly metallized plastic product with a gold hue and free of any gold elements is described below.

First of all, a plastic body is provided. The plastic body is in ABS. The plastic body has a suitable shape for manufacturing a plug of a perfume bottle.

The outer surface of the plastic body is subject to acid etching with sulfochromic acid by soaking in a solution of chromic acid with a concentration of 400 g/L and of sulfuric acid with a concentration of 400 g/L at a temperature of 65° C. for 6 minutes. Next, a preparation layer in nickel is deposited at the surface of the plastic body by chemical deposition with palladium in a catalytic amount. This preparation layer has a thickness of 1 µm. This preparation layer allows the plastic body to be made electrically conducting, which is required in order to be able to then carry out electrolyses.

A copper cover is consequently deposited on the first nickel or copper layer by electrolysis. In order to carry out the electrolysis, the plastic body covered with the preparation layer is soaked in a tank filled with a mixture of copper sulfate and of sulfuric acid in solution for 22 minutes. The electrolysis is stopped when the copper cover on the plastic body has a thickness of 12 µm.

A nickel cover is then deposited on the copper cover by electrolysis. The plastic body is soaked in a tank filled with a mixture of nickel sulfate, nickel chloride and boric acid in solution for 10 minutes. The nickel cover has a thickness of 6 μm.

A chromium layer is then deposited via an electrolytic route on the nickel cover. The plastic body is soaked in a tank filled with a solution of chromic acid for 2 minutes and 30 seconds. The chromium layer has a thickness of 0.9 μm.

A Cu—Al alloy (UNS C61000) layer consisting of 92% by weight of copper, 8% by weight of aluminum and less than 0.85% by weight of impurity is deposited by cathode sputtering directly on the chromium layer for 2.3 seconds. The target is a 420 mm×100 mm plate, with a thickness of 10 mm in a Cu—Al alloy of the same composition as the Cu—Al alloy layer to be formed on the chromium layer. The distance from the plastic body to the target is 100 mm. The cathode sputtering power is adjusted to 30 kW. The speed of rotation is adjusted to 100 rpm. The argon flow is set to a value of 500 cm$^3$/mn. A Cu—Al alloy layer with a thickness of 50 nm is obtained.

Finally, a transparent organic acrylate overlayer is applied on the Cu—Al alloy layer. The overlayer has a thickness of 12 μm.

The color and brightness measurements give the coordinates (79.6; 3.95; 21.16) in the L*a*b* model.

Example 2

Example 2 is carried out in the same way as Example 1 with the only exception that the duration of the cathode sputtering is 1.4 seconds.

The color and brightness measurements give the coordinates (80.93; 3.05; 19.48) in the L*a*b* model.

Example 3

An exemplary method for manufacturing an at least partly metallized plastic product with a silver hue and free of any silver elements is described below.

The method used is identical with the one of Example 1 with the only exception that the metal used for cathode sputtering is aluminum (UNS A6061).

The color and brightness measurements give the coordinates (87.85; −0.95; 6.97) in the L*a*b* model.

Comparative Examples

Table 1 hereafter reports the different methods used for 13 examples as well as their color.

TABLE 1

| | Galvanization (metal used) | Cathode sputtering (metal | Overlayer | Color |
|---|---|---|---|---|
| Example 1 | chromium | Cu—Al* (2.3 | colorless | gold |
| Example 2 | chromium | Cu—Al* (1.4 | colorless | gold |
| Example 3 | chromium | Al**( . . . ) | colorless | silver |
| Example 4 | gold | without | without | gold |
| Example 5 | gold | without | without | gold |
| Example 6 | nickel | without | without | nickel |
| Example 7 | chromium | without | without | chromium |
| Example 8 | nickel | without | gold-colored | gold |
| Example 9 | chromium | without | gold-colored | gold |
| Example 10 | without | Cu—Al* | colorless | gold |
| Example 11 | silver | without | without | silver |

TABLE 1-continued

| | Galvanization (metal used) | Cathode sputtering (metal | Overlayer | Color |
|---|---|---|---|---|
| Example 12 | chromium | aluminum | without | aluminum |
| Example 13 | without | aluminum | colorless | silver |

*The Cu—Al alloy (UNS C61000) comprising 92% by weight of copper, 8% by weight of aluminum and less than 0.85% by weight of impurity;
**aluminum UNS A6061.

Table 2 hereafter reports the hue coordinates measured for each of the 13 examples listed in Table 1.

TABLE 2

| | L* | a* | b* |
|---|---|---|---|
| Example 1 | 79.6 | 3.95 | 21.16 |
| Example 2 | 80.93 | 3.05 | 19.48 |
| Example 3 | 87.85 | −0.95 | 6.97 |
| Example 4 | 86.9 | 2.96 | 22.97 |
| Example 5 | 82.75 | 2.12 | 16.32 |
| Example 6 | 81.6 | 0.84 | 6.46 |
| Example 7 | 83.41 | −0.82 | −2.03 |
| Example 8 | 73.87 | 1.92 | 19 |
| Example 9 | 74.32 | 0.74 | 12.17 |
| Example 10 | 80.92 | 5.15 | 19.25 |
| Example 11 | 95.15 | −0.8 | 7.95 |
| Example 12 | 90.99 | −0.57 | 4.4 |
| Example 13 | 90 | −0.87 | 1.39 |

It is seen that Examples 8 and 9, although their color is close to that of Examples 4 and 5 (standards), suffer from too low brightness relatively to the Examples 1 and 2 corresponding to the present invention. Moreover, the fact that the overlayer used is colored, the hue of the Examples 8 and 9 is not constant over time and becomes duller.

Example 10 gives a good result as regards the hue, although redder than that of the Examples 1 and 2. However, the touch obtained with Example 10 is not metallic, in other words it is not cold.

It is seen that Examples 1 and 2 have a hue closer to those of Examples 4 and 5 (standard for the gold hue), indeed their coordinates a* and b* are closer to those of Examples 4 and 5 than the coordinates a* and b* of Examples 8, 9 and 10. Moreover, the brightness of Examples 1 and 2 is greater than that of Examples 8 and 9.

Example 13 also gives a good result, although the hue is less yellow than Example 11 which forms a reference example for the silver hue. Just like in Example 10, the obtained touch is not metallic.

Example 3, although the brightness is less than that of Example 13 has coordinates a*b* closer to Example 11 than the coordinates of Example 13.

The invention claimed is:

1. An at least partly metallized plastic product of a gold or silver hue and free of any gold and silver element, comprising a plastic body, a galvanized chromium layer covering a surface of the plastic body to be metallized, without an organic sublayer between the plastic body and galvanized chromium layer, and a metal layer directly on the galvanized chromium layer, the metal layer being copper, a mixture of metals comprising at least 70% by weight of copper, a copper alloy comprising at least 70% by weight of copper, or aluminum,
    wherein the galvanized chromium layer comprises both (i) a preparation layer deposited on the substrate and comprising nickel or copper and (ii) a copper cover layer deposited on the preparation layer, wherein both (i) and (ii) are deposited between the substrate and a chromium layer.

2. The plastic product according to claim 1, wherein the metal layer comprises a Cu—Al alloy comprising at least 70% by weight of copper.

3. The plastic product according to claim 2, wherein the Cu—Al alloy comprises between 80-95% by weight of copper, between 5-20% by weight of aluminum, and less than 5% by weight of impurity.

4. The plastic product according to claim 1, wherein the metal layer comprises aluminum.

5. The plastic product according to one of claims 1 to 4, wherein the galvanized chrome layer comprises a chromium layer having a thickness between 0.1 and 2 μm.

6. The plastic product according to one of claims 1 to 4, wherein the metal layer has a thickness between 30 and 100 nm.

7. The plastic product according to one of claims 1 to 4, further comprising a transparent protection overlayer directly on the metal layer.

8. The plastic product according to claim 7, wherein the transparent protection overlayer is a transparent organic overlayer.

9. The plastic product of claim 8, wherein the transparent organic overlayer comprises an organic polymer selected from the group consisting of a polyester, an acrylic polymer, an acrylate polymer, and polyurethane.

10. The plastic product of claim 7, wherein the transparent protection overlayer is a transparent inorganic layer.

11. The plastic product of claim 10, wherein the transparent inorganic layer comprises a silicon oxide.

12. The plastic product of claim 1, wherein the galvanized chromium layer comprises (i) the preparation layer comprising nickel or copper, (ii) the copper cover layer, (iii) a nickel cover layer, and (iv) the chromium layer,
wherein the preparation layer is deposited on the substrate, the copper cover layer is deposited on the preparation layer, the nickel cover layer is deposited on the copper cover layer, and the chromium layer is deposited on the nickel cover layer.

13. The plastic product of claim 12, wherein the metal layer comprises a copper alloy comprising at least 70% by weight of copper.

14. The plastic product of claim 1, wherein the metal layer comprises a mixture of metals comprising at least 70% by weight of copper.

15. The plastic product of claim 3, wherein the Cu—Al alloy comprises about 92% by weight of copper and about 8% by weight of aluminium.

16. A method for manufacturing the at least partly metallized plastic product of claim 1, the method comprising the following steps:
galvanization of a surface of the plastic body to be metallized for forming a galvanized chromium layer on the surface of the plastic body to be metallized, without an organic sublayer between the plastic body and galvanized chromium layer;
deposition by evaporation, preferably by cathode sputtering, of a metal layer directly on the galvanized chromium layer, the metal layer being copper, a mixture of metals comprising at least 70% by weight of copper, a copper alloy comprising at least 70% by weight of copper, or aluminum.

17. The method according to claim 16, wherein the metal layer comprises a Cu—Al alloy comprising at least 70% by weight of copper.

18. The method according to claim 17, wherein the Cu—Al alloy comprises between 80-95% by weight of copper, between 5-20% by weight of aluminum, and less than 5% by weight of impurity.

19. The method according to claim 16, wherein the metal layer comprises aluminum.

20. The method according to any of claims 16 to 19, wherein the galvanization step comprises the following sub-steps:
the plastic body is made conducting by acid etching followed by a deposition of nickel or copper via a chemical route activated with palladium in order to form a preparation layer;
a copper cover is electrolytically deposited directly on the preparation layer; and
the chromium layer is deposited via an electrolytic route on the copper cover, wherein
the galvanized chromium layer comprises the preparation layer, the copper cover and the chromium layer.

21. The method according to one of claims 16 to 19, further comprising a step for applying a transparent protection overlayer directly on the metal layer.

* * * * *